US010667428B1

(12) United States Patent  
Kuo et al.

(10) Patent No.: US 10,667,428 B1  
(45) Date of Patent: May 26, 2020

(54) HEAT DISSIPATION MODULE MANUFACTURING METHOD, HEAT DISSIPATION MODULE AND ELECTRONIC DEVICE

(71) Applicant: HTC Corporation, Taoyuan (TW)

(72) Inventors: Chih-Yao Kuo, Taoyuan (TW); Chin-Kai Sun, Taoyuan (TW); Chun-Lung Chu, Taoyuan (TW); Wei-Cheng Liu, Taoyuan (TW)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 16/419,015

(22) Filed: May 22, 2019

Related U.S. Application Data

(60) Provisional application No. 62/770,755, filed on Nov. 22, 2018.

(51) Int. Cl.  
*H05K 7/20* (2006.01)

(52) U.S. Cl.  
CPC ................ *H05K 7/20272* (2013.01)

(58) Field of Classification Search  
CPC ......... H01L 23/427; H01L 2225/06589; H01L 23/34; F28D 15/0233; F28D 15/046; F28D 15/0266; F28D 15/0283; F28D 15/0275; F28D 15/04; F28D 2015/0225; F28D 2021/0028; F28F 2260/00; F28F 3/12; F28F 21/062; H05K 1/0204; H05K 1/0203; H05K 7/20309; H05K 7/20336; H05K 2201/056;

(Continued)

(56) References Cited

U.S. PATENT DOCUMENTS

| 6,263,959 B1 * | 7/2001 | Ikeda .................. F28D 15/0233 165/104.26 |
| 9,247,034 B2 | 1/2016 | Hsieh et al. |
| 10,019,046 B2 * | 7/2018 | Shen ...................... G06F 1/203 |

(Continued)

FOREIGN PATENT DOCUMENTS

| CN | 207783389 | 8/2018 |
| TW | 540989 | 7/2003 |
| TW | M530014 | 10/2016 |

OTHER PUBLICATIONS

"Office Action of Taiwan Counterpart Application," dated Dec. 16, 2019, p. 1-p. 17.

*Primary Examiner* — Mandeep S Buttar  
(74) *Attorney, Agent, or Firm* — JCIPRNET

(57) ABSTRACT

A heat dissipation module manufacturing method, a heat dissipation module and an electronic device are provided. The heat dissipation module manufacturing method includes the steps: providing a first substrate, the first substrate has a first portion, a second portion, a connecting portion connected to the first portion and the second portion; performing a first etching on a surface of the first substrate to form a plurality of grooves; providing a plurality of second substrates, and bonding the second substrates to the first substrate to cover the grooves and form a plurality of chambers; filling the chambers with a working fluid; and sealing the chambers. The heat dissipation module includes the first substrate, the working fluid, and the second substrates. The electronic device includes the heat dissipation module and a plurality of electronic modules. The first portion and the second portion of the heat dissipation module respectively contact the electronic modules.

19 Claims, 5 Drawing Sheets

(58) Field of Classification Search
CPC ......... H05K 2201/09036; H05K 3/107; H05K 7/20509; H05K 7/20272
USPC .......... 361/700; 165/104.26, 104.21, 104.33, 165/168, 80.4; 257/E23.088
See application file for complete search history.

(56) References Cited

U.S. PATENT DOCUMENTS

2008/0264611 A1* 10/2008 Chang ................. H01L 21/4882
 165/104.26
2009/0027840 A1 1/2009 Tomioka

* cited by examiner

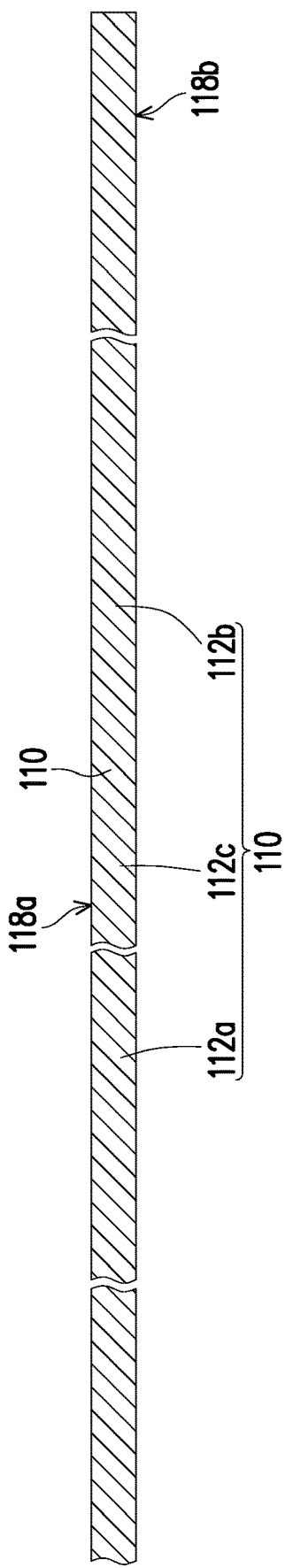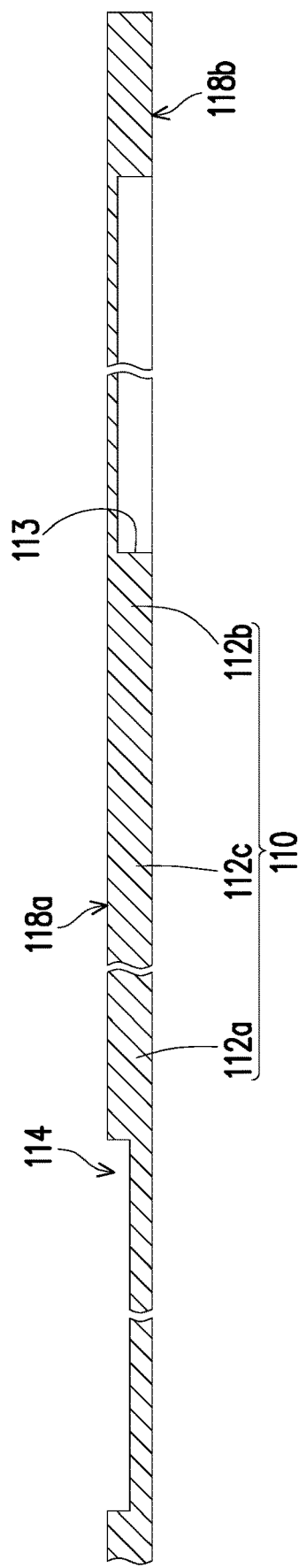

HEAT DISSIPATION MODULE MANUFACTURING METHOD, HEAT DISSIPATION MODULE AND ELECTRONIC DEVICE

CROSS-REFERENCE TO RELATED APPLICATION

This application claims the priority benefit of U.S. provisional application Ser. No. 62/770,755, filed on Nov. 22, 2018. The entirety of the above-mentioned patent application is hereby incorporated by reference herein and made a part of this specification.

TECHNICAL FIELD

The disclosure relates to a manufacturing method, a module and a device, more particularly, relates to a heat dissipation module manufacturing method, a heat dissipation module and an electronic device.

DESCRIPTION OF RELATED ART

The performance of electronic device is constantly improved. Therefore, the heat generated when the electronic device operates becomes higher and higher. How to improve the heat dissipation effect of electronic device having a limited space has become the goal of each manufacturer.

SUMMARY

The disclosure provides a heat dissipation module manufacturing method, a heat dissipation module, and an electronic device, capable of solving the problems that the space utilization rate and the heat dissipation efficiency in the existing heat dissipation module and the electronic device cannot be both considered.

The heat dissipation module manufacturing method of the disclosure includes the following steps: providing a first substrate, wherein the first substrate has a first portion, a second portion, and a connecting portion connected to the first portion and the second portion; performing a first etching on a surface of the first substrate to form a plurality of grooves; providing a plurality of second substrates, and bonding the second substrates to the first substrate to cover the grooves and form a plurality of chambers; filling the chambers with a working fluid; and sealing the chambers.

The heat dissipation module of the disclosure includes a first substrate, a working fluid, and a plurality of second substrates. The first substrate has a first portion, a second portion, a connecting portion, and a plurality of grooves. The connecting portion is connected to the first portion and the second portion. The grooves are respectively formed on the first substrate by etching. The plurality of second substrates respectively cover the grooves on the first substrate to form a plurality of chambers. The working fluid is filled into the chambers.

The electronic device of the disclosure includes the heat dissipation module and a plurality of electronic modules. The heat dissipation module includes the first substrate, the working fluid, and the second substrates. The first substrate has a first portion, a second portion, a connecting portion, and a plurality of grooves. The connecting portion is connected to the first portion and the second portion, and the connecting portion is partially bent. The grooves are respectively formed on the first substrate by etching. The first portion and the second portion respectively contact the electronic modules. The plurality of second substrates respectively cover the grooves on the first substrate to form a plurality of chambers. The working fluid is filled into the chambers.

Based on the above, in the heat dissipation module manufacturing method, the heat dissipation module, and the electronic device of the disclosure, the heat dissipation efficiency is improved, and it meets the design trend towards developing thinner electronic device.

In order to make the aforementioned and other features and advantages of the disclosure more comprehensible, embodiments accompanying figures are described in detail belows.

BRIEF DESCRIPTION OF THE DRAWINGS

FIGS. 1A to 1E are schematic views illustrating a heat dissipation module manufacturing method according to one embodiment of the disclosure.

DESCRIPTION OF THE EMBODIMENTS

Figure 1C:
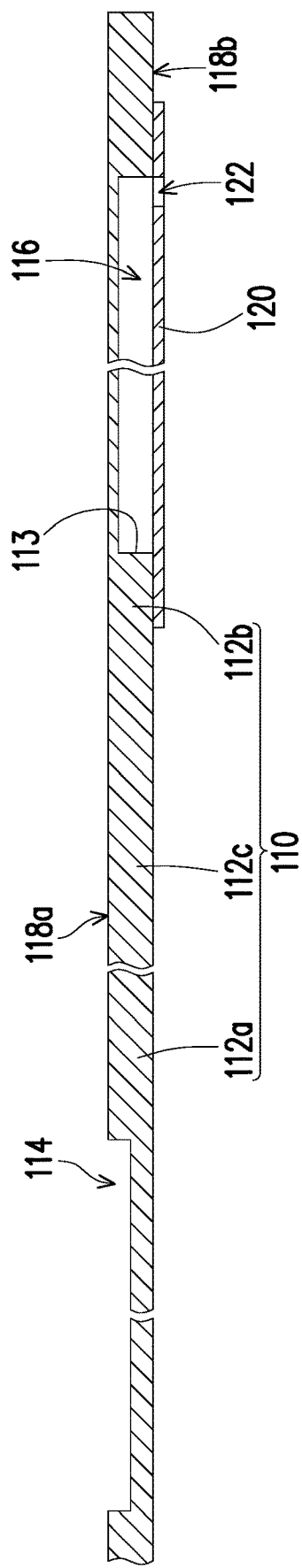
Figure 1D:
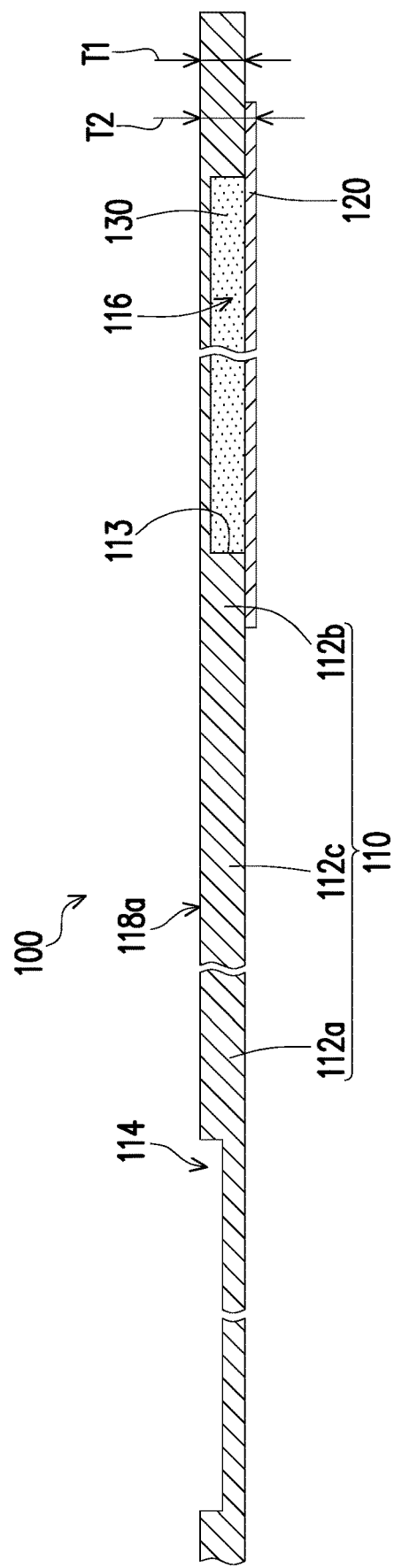
Figure 1E:
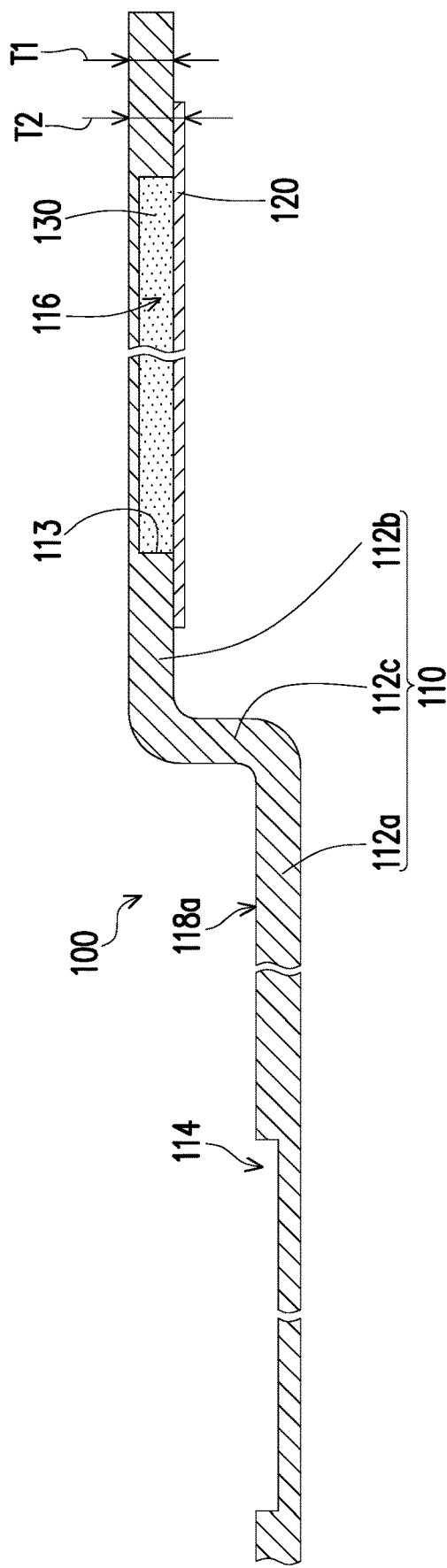

FIGS. 1A to 1E are schematic views illustrating a heat dissipation module manufacturing method according to one embodiment of the disclosure. In the heat dissipation module manufacturing method of the present embodiment, firstly, the first substrate 110 is provided as shown in FIG. 1A. The first substrate 110 is divided into the first portion 112a, the second portion 112b, and a connecting portion 112c. The connecting portion 112c is connected to the first portion 112a and the second portion 112b. After that, as shown in FIG. 1B, the first etching is performed on a surface 118b of the first substrate 110 to form a groove 113. Subsequently, as shown in FIG. 1C, the second substrate 120 is provided, and the second substrate 120 is bonded to the first substrate 110 to cover the groove 113 and form a chamber 116. Next, as shown in FIG. 1D, the working fluid 130 is filled into the chamber 116, and the chamber 116 is sealed. Finally, as shown in FIG. 1E, the connecting portion 112c is bent to obtain a heat dissipation module 100.

It should be noted here, for convenience of description, FIG. 1A to FIG. 1E simply show a single one of connecting portion 112c, a single one of the second portion 112b, a single one of the groove 113, a single one of the second substrate 120, and a single one of the chamber 116. However, the number of the connecting portion 112c, the second portion 112b, the groove 113, the second substrate 120, and the chamber 116 may also more than one, the disclosure is not limited thereto.

In the present embodiment, the steps of bonding the second substrate 120 to the first substrate 110 and filling the chamber 116 with the working fluid 130 may include, firstly, placing the second substrate 120 on the first substrate 110. Subsequently, the second substrate 120 is soldered on the first substrate 110 to cover the groove 113 in order to form the chamber 116 and to reserve an injection hole 122. The method for soldering the second substrate 120 to the first substrate 110 includes diffusion bonding but is not limited thereto. After that, the chamber 116 is vacuumized. Next, the working fluid 130 is filled into the chamber 116 through the injection hole 122. Finally, the injection hole 122 is soldered by using a solder in order to seal the injection hole 122. In other embodiments, the method for soldering the second substrate 120 on the first substrate 110 includes applying solder bonding.

Referring to FIG. 1A and FIG. 1B, in the present embodiment, the heat dissipation module manufacturing method further includes performing the second etching on a surface 118a of the first substrate 110 to form at least one accommodating space 114. It should be noted here, the sequence of the steps of performing the first etching and the second etching on the surface 118b and the surface 118a of the first substrate 110 are not restricted in the present embodiment and are determined according to requirements.

As shown in FIG. 1E, the first substrate 110 has a thickness T1 except for a portion having the accommodating space 114. The thickness T1 is between 0.3 millimeters and 0.4 millimeters as an example. The heat dissipation module 100 has a thickness T2 at a portion having the chamber 116. The thickness T2 is between 0.3 millimeters and 0.5 millimeters as an example.

Figure 2:
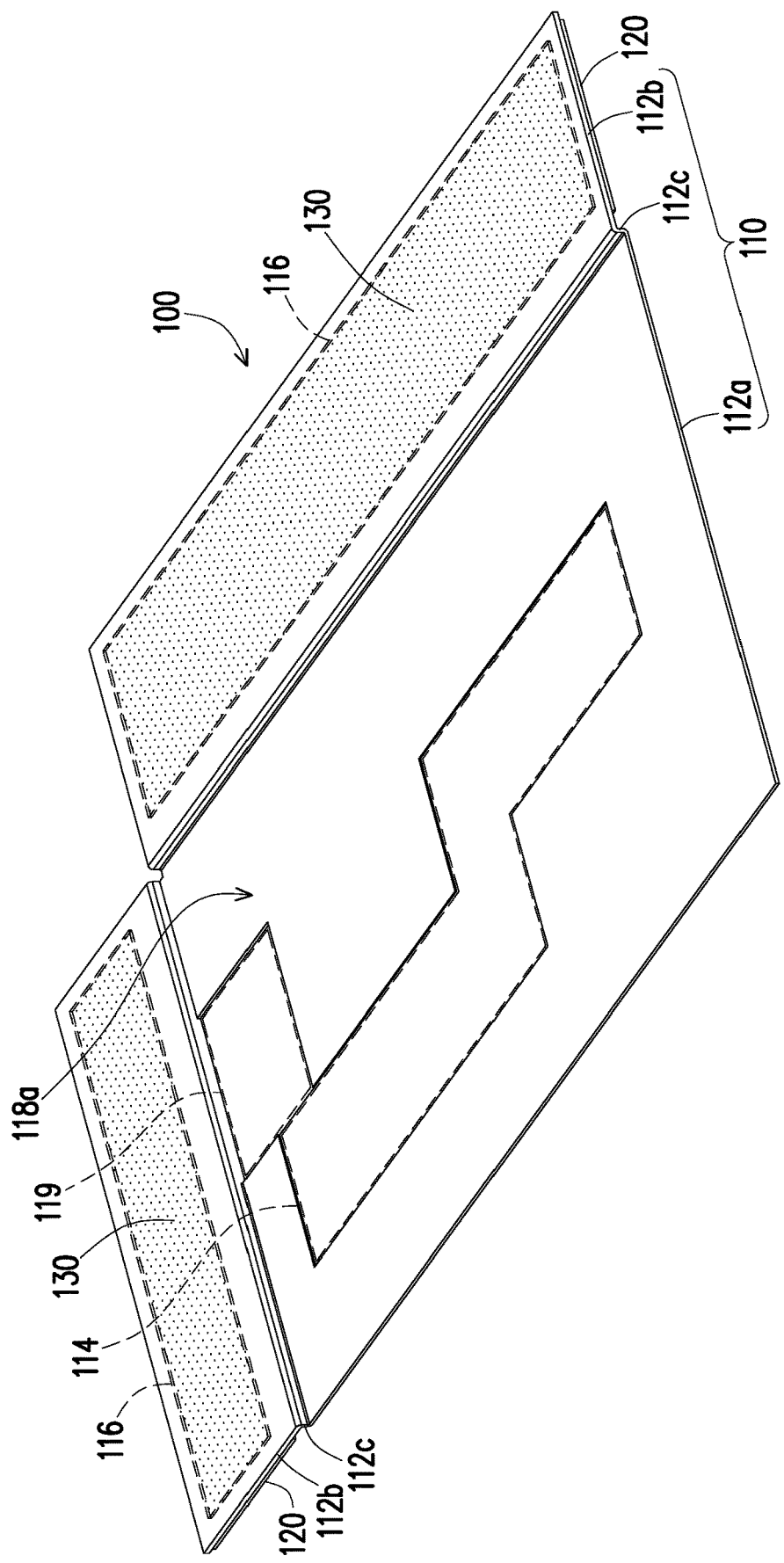
FIG. 2 is three-dimensional schematic view illustrating a heat dissipation module formed by a heat dissipation module manufacturing method according to one embodiment of the disclosure.

FIG. 2 is three-dimensional schematic view illustrating a heat dissipation module formed by a heat dissipation module manufacturing method according to one embodiment of the disclosure. Referring to FIG. 1E and FIG. 2, the heat dissipation module manufacturing method in the present embodiment further includes bending the connecting portion 112c to form one of first portion 112a, two of second portions 112b, and two of connecting portions 112c. Each of the connecting portions 112c is connected to the first portion 112a and the corresponding second portion 112b. Each of the second portions 112b has the respective chamber 116 covered by the second substrate 120. Each of the chambers 116 is filled by the respective working fluid 130. In the present embodiment, the first portion 112a and the second portion 112b present a flat plate shape and are parallel to each other, but other embodiments (not shown) are not limited thereto. Otherwise, the number of the first portions 112a, the second portions 112b, and the connecting portions 112c are not restricted.

Referring to FIG. 2, the second etching may further be performed on the surface 118a of the first substrate 110 to form at least one through hole 119. The through hole 119 may be used to accommodate the electronic element having great height, such as camera lens.

Figure 3:
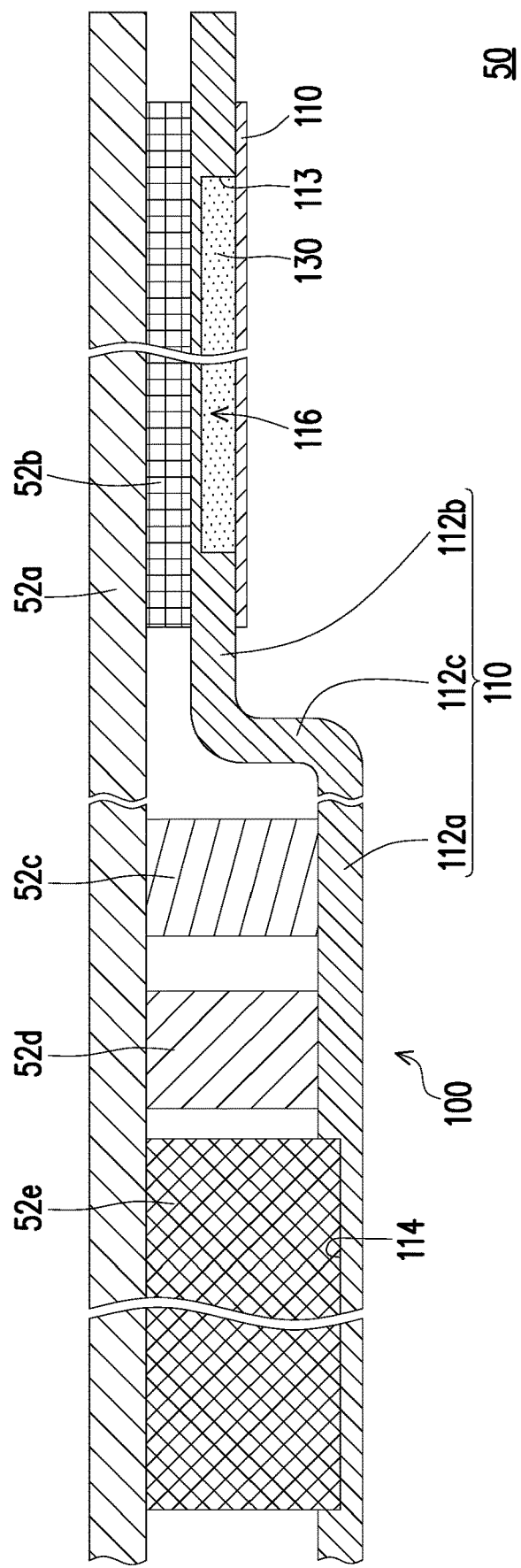
FIG. 3 is a schematic view of an electronic device according to one embodiment of the invention.

FIG. 3 is a schematic view of an electronic device according to one embodiment of the invention. Referring to FIG. 3, the electronic device 50 includes a heat dissipation module 100 and a plurality of electronic modules (such as electronic modules 52b, 52c, 52d, and 52e). The first portion 112a and the second portion 112b are respectively in contact with the electronic modules 52b, 52c, 52d, and 52e disposed on a circuit board 52a. The heat of the electronic modules 52b, 52c, 52d, and 52e is conducted through the first substrate 110 to the working fluid 130 inside the chamber 116 of the first substrate 110, so as to perform heat dissipation.

For example, the second portion 112b is in contact with the electronic module 52b having a small height. The first portion 112a is in contact with the electronic module 52c and the electronic module 52d having medium height. A part of the electronic module 52e having great height may be accommodated into the accommodating space 114 and is in contact with the first portion 112a, so as to reduce the overall thickness of the electronic device 50. Therefore, the first substrate 110 having the accommodating space 114 and the connecting portion 112c may be in contact with more parts of the electronic modules 52b, 52c, 52d, and 52e. Accordingly, in the heat dissipation module manufacturing method, the heat dissipation module 100, and the electronic device 50 of the disclosure, the first substrate 110 has a plurality of chambers 116, and the electronic modules 52b, 52c, 52d, and 52e are simultaneously in contact with the first substrate 110, so the heat dissipation module 100 has a large heat transfer area to transfer the heat of the electronic modules 52b, 52c, 52d, and 52e, in order to improve the heat dissipation efficiency of the heat dissipation module 100 and the electronic device 50. Moreover, the first portion 112a of the first substrate 110 is etched to form the accommodating space 114 which is used to accommodate the electronic module 52e. Hence, the internal space of the electronic device 50 can be effectively utilized, and, at the same time, it meets the design trend towards developing thinner electronic device 50.

Summarily, in the heat dissipation module manufacturing method, the heat dissipation module, and the electronic device of the disclosure, the first substrate has a plurality of chambers, and the electronic modules are simultaneously in contact with the first portion and the second portion of the first substrate, so the heat dissipation module has a large heat transfer area to transfer the heat of the electronic modules, in order to improve the heat dissipation efficiency of the heat dissipation module and the electronic device. Moreover, the first portion of the first substrate is etched to form the accommodating space which is used to accommodate the electronic module. Hence, the internal space of the electronic device can be effectively utilized, and, at the same time, it meets the design trend towards developing thinner electronic device.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A heat dissipation module manufacturing method, comprising:
    providing a first substrate, wherein the first substrate has a first portion, a second portion, and a connecting portion connected to the first portion and the second portion;
    performing a first etching on a surface of the first substrate to form a plurality of grooves;
    providing a plurality of second substrates, and bonding the second substrates to the first substrate to cover the grooves and form a plurality of chambers;
    filling the chambers with a working fluid; and
    sealing the chambers.

2. The heat dissipation module manufacturing method as recited in claim 1, wherein the steps of bonding the second substrates to the first substrate and filling the chambers with the working fluid comprise:
    placing the second substrates on the first substrate;
    soldering each of the second substrates on the first substrate to cover each of the grooves and respectively reserve an injection hole;
    filling the chamber with the working fluid through the corresponding injection hole; and
    soldering each of the injection holes by using a solder to seal each of the injection holes.

3. The heat dissipation module manufacturing method as recited in claim 2, wherein the step of soldering each of the second substrates on the first substrate comprises performing diffusion bonding or applying solder bonding.

4. The heat dissipation module manufacturing method as recited in claim 1, after sealing the chambers, further comprising:
bending the connecting portion.

5. The heat dissipation module manufacturing method as recited in claim 1, further comprising:
performing a second etching on a surface of the first substrate to form at least one accommodating space.

6. The heat dissipation module manufacturing method as recited in claim 1, further comprising:
performing a second etching on a surface of the first substrate to form at least one through hole.

7. A heat dissipation module, comprising:
a first substrate, having a first portion, a second portion, a connecting portion, and a plurality of grooves, wherein the connecting portion is connected to the first portion and the second portion, the grooves are respectively formed on the first substrate by etching;
a plurality of second substrates, respectively covering the grooves on the first substrate to form a plurality of chambers; and
a working fluid, filled into the chambers.

8. The heat dissipation module as recited in claim 7, wherein thicknesses of portions having the chambers of the heat dissipation module are between 0.3 millimeters and 0.5 millimeters.

9. The heat dissipation module as recited in claim 7, wherein the first portion and the second portion present a flat plate shape.

10. The heat dissipation module as recited in claim 7, wherein the connecting portion is partially is partially bent.

11. The heat dissipation module as recited in claim 7, wherein the first substrate is etched to form at least one accommodating space.

12. The heat dissipation module as recited in claim 11, wherein a thickness of the first substrate is between 0.3 millimeters and 0.4 millimeters except for a portion having the accommodating space.

13. The heat dissipation module as recited in claim 7, wherein the first substrate is etched to form at least one through hole.

14. An electronic device, comprising:
a plurality of electronic modules; and
a heat dissipation module, comprising:
a first substrate, having a first portion, a second portion, a connecting portion, and a plurality of grooves, wherein the connecting portion is connected to the first portion and the second portion, the connecting portion is partially bent, the grooves are respectively formed on the first substrate by etching, and the first portion and the second portion are respectively in contact with the electronic modules;
a plurality of second substrates, respectively covering the grooves on the first substrate to form a plurality of chambers; and
a working fluid, filled into the chambers.

15. The electronic device as recited in claim 14, wherein thicknesses of portions having the chambers of the heat dissipation module are between 0.3 millimeters and 0.5 millimeters.

16. The electronic device as recited in claim 14, wherein the first portion and the second portion present a flat plate shape.

17. The electronic device as recited in claim 14, wherein the first substrate is etched to form at least one accommodating space.

18. The electronic device as recited in claim 17, wherein a thickness of the first substrate is between 0.3 millimeters and 0.4 millimeters except for a portion having the accommodating space.

19. The electronic device as recited in claim 14, wherein the first substrate is etched to form at least one through hole.

* * * * *